United States Patent
Lu et al.

(10) Patent No.: US 10,393,790 B2
(45) Date of Patent: Aug. 27, 2019

(54) METHOD FOR TESTING CONNECTIVITY

(71) Applicants: Inventec (Pudong) Technology Corporation, Shanghai (CN); INVENTEC CORPORATION, Taipei (TW)

(72) Inventors: Hsueh-Chih Lu, Taipei (TW); Lien-Feng Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 109 days.

(21) Appl. No.: 15/866,440

(22) Filed: Jan. 9, 2018

(65) Prior Publication Data

US 2019/0154745 A1 May 23, 2019

(30) Foreign Application Priority Data

Nov. 21, 2017 (CN) .......................... 2017 1 1164999

(51) Int. Cl.
*G01R 31/02* (2006.01)

(52) U.S. Cl.
CPC ......... *G01R 31/025* (2013.01); *G01R 31/026* (2013.01)

(58) Field of Classification Search
CPC .............. G01R 31/02–11; H04M 3/22; H04M 3/26–301
See application file for complete search history.

(56) References Cited

U.S. PATENT DOCUMENTS

| | | | | |
|---|---|---|---|---|
| 3,728,620 A * | 4/1973 | Heins | .................. | G01R 31/085 324/520 |
| 4,528,427 A * | 7/1985 | Gadonna | ............... | H04M 3/301 324/520 |
| 5,760,591 A * | 6/1998 | Matsuda | ............. | G01R 31/041 324/521 |
| 6,333,625 B1 * | 12/2001 | Linder | .................. | G01R 31/08 324/66 |
| 2006/0114001 A1 * | 6/2006 | Wang | .................. | G01R 31/025 324/523 |
| 2012/0194201 A1 * | 8/2012 | Saloio | .................... | G01R 27/26 324/537 |

\* cited by examiner

*Primary Examiner* — Tung X Nguyen
*Assistant Examiner* — David B Frederiksen
(74) *Attorney, Agent, or Firm* — CKC & Partners Co., LLC (57) ABSTRACT

The present disclosure relates to a method for testing connectivity. The method is applied to an electronic equipment which is disposed include two test units (e.g. network interface controller, RJ-45 connector) and a network transformer. The test unit couple to the network transformer so that can send a high frequency test signal or a low frequency test signal to the network transformer respectively. When the test unit receives a low frequency response signal, it means correspond internal circuitry of the network transformer does not have a open circuit fault. When the test unit does not receive a high frequency response signal, it means correspond pins of the network transformer does not have a short circuit fault.

15 Claims, 6 Drawing Sheets

METHOD FOR TESTING CONNECTIVITY

This application claims priority to China Application Serial Number 201711164999.3, filed Nov. 21, 2017, which is herein incorporated by reference.

BACKGROUND

Technical Field

The present disclosure relates to a method for testing connectivity. The method is used to determine whether there is an open circuit fault in an internal circuitry in a network transformer, and determine whether there is a short circuit fault at a pin of the network transformer.

Description of Related Art

In electronic devices, network interface controller is a necessary hardware for network communication. In order to effectively isolate external noise and ensure the stability of the signal transmission, the network interface controller is coupled to a network output interface (such as RJ-45 connection interface) via a network transformer. The electronic device can connect to other devices through the network output interface. Network signals from other devices can be transmitted to the network interface controller through the processing of the network output interface and the network transformer sequentially.

Since the network transformer probability obtains some errors in manufacturing, assembling and welding, the connectivity of the network transformer must be tested through a test program before selling, so as to make sure that an internal circuitry of the network transformer are working properly. The efficiency of the test program is important because it will directly affect the production cost of the network transformer.

At present, a method for testing connectivity is using a thimble. The thimble is coupled to a pin of the network transformer, then sends a test signal to test the connectivity of the network transformer. However, this method is not ideal in efficiency and cost. Therefore, the purpose of the present disclosure is to design a better test method for the network transformer.

SUMMARY

One aspect of the present disclosure is a method for testing connectivity. The method is applied to an electronic equipment, wherein the electronic equipment at least includes two test units and a network transformer. The test units is respectively coupled to the network transformer, and the network transformer at least includes a transformer circuit. The method includes the following steps. First, a test unit of the test units sending a low frequency test signal or a high frequency test signal to the network transformer by using a boundary scan manner. Then, determining whether the test unit receives a low frequency response signal or a high frequency response signal, and then, identifying that an internal circuitry, which is disposed in the network transformer and between the transformer circuit and the test unit, does not have an open circuit fault, when the test unit receives the low frequency response signal; otherwise, identifying that the internal circuitry, which is disposed in the network transformer and between the transformer circuit and the test unit, have an open circuit fault, when the test unit does not receive the low frequency response signal. Identifying that a pin of the network transformer, which corresponds to the test unit, has a short circuit fault, when the test unit receives the high frequency response signal; otherwise, identifying that the pin of the network transformer, which corresponds to the test unit, does not have the short circuit fault, when the test unit does not receive the high frequency response signal.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or similar parts for better understanding.

In the course of the research, the inventors found that there are many shortcomings in efficiency, accuracy and cost of current detection methods for network transformers. For example, the method which testing the network transformer through the thimble will increase the cost of test program because it need to add an additional test pin. In addition, since the thimble is directly coupled to the pins of the network transformer, this method will not detect the error when the adjacent pins are short circuit caused by the welding error.

In fact, at present, most precision electronic components are designed with boundary scan interface, which can directly receive external input test signals, and then detect whether the internal circuitry is normal. However, the boundary scan manner cannot be directly applied to network transformers, because the transformer circuit in the network transformer will isolate the test signal, so that the test signal cannot pass through the network transformer.

As above, the method of testing transformers through the thimble and the boundary scan manner both are unable to be directly and efficiently applied to the test program of the network transformer, and the purpose of the present disclosure is to solve this problem.

The present disclosure provides a method for testing connectivity of network transformer through a low frequency test signal and a high frequency test signal.

Figure 1A:
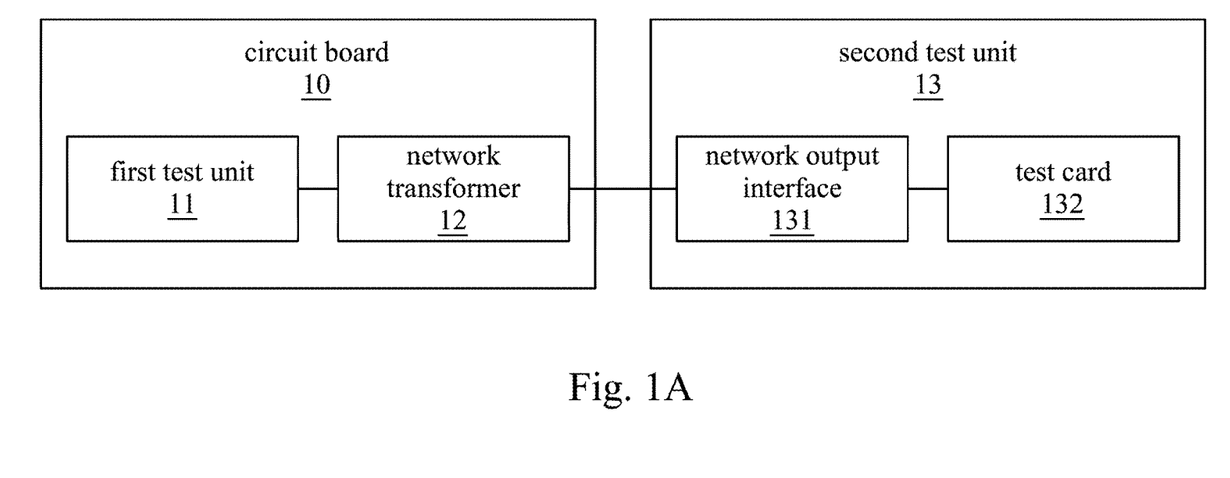
FIG. 1A is a diagram illustrating an electronic equipment according to some embodiments of the present disclosure.
Figure 1B:
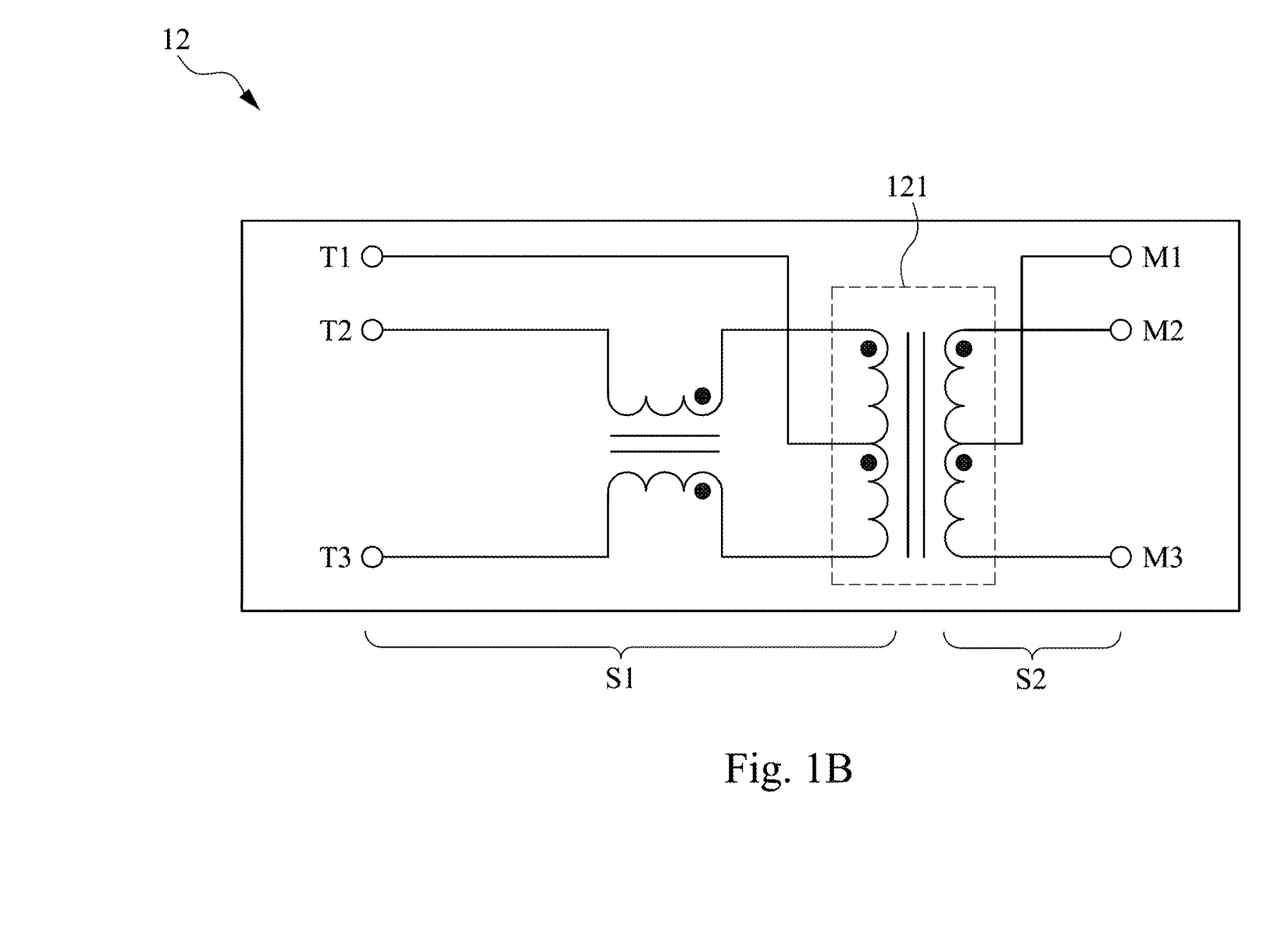
FIG. 1B is a diagram illustrating a network transformer 12 according to some embodiments of the present disclosure.

Reference is made to FIG. 1A and 1B. FIG. 1A is a diagram illustrating an electronic equipment according to some embodiments of the present disclosure. FIG. 1B is a diagram illustrating a network transformer 12 according to some embodiments of the present disclosure. The electronic device at least includes a first test unit 11, a second test unit 13 and a network transformer 12, wherein the first test unit 11 and the second test unit 13 are electrically coupled to the network transformer 12 respectively. In some embodiments, the first test unit 11 is a network interface controller, and the second test unit 13 includes a network output interface 131 (e.g., RJ-45 connector) and a test card 132.

Refer to FIG. 1A and FIG. 1B. The network transformer 12 is provided with a plurality of first pins T1-T3 on one side and a plurality of second pins M1-M3 on the other side. The first pins T1-T3 and the second pins M1-M3 are welded to a circuit board 10 and respectively coupled to the first test unit 11 and the second test unit 13 through the circuit board 10. The first pins T1-T3 are electrically coupled to the first test unit 11 (network interface controller). The second pins M1-M3 are electrically coupled to the network output interface 131. The test card 132 is configured in the electronic device and is electrically coupled to the network output interface 131 so that it can be indirectly connected to the network transformer 12 through the network output interface 131.

The network transformer 12 at least includes a transformer circuit 121. Since the transformer circuit 121 will isolate test signals, the network transformer 12 is divided into a first side S1 and a second side S2 according to the transformer circuit 121 for connectivity testing, respectively. The connectivity test method allows each test unit 11,13 to send a low frequency test signal and/or a high frequency test signal to the network transformer 12 by using the boundary scan manner.

Since the characteristic of inductance in the transformer circuit 121 is that "the low-frequency signal is able to pass through as if the transformer circuit 121 is a short circuit, and the high-frequency signal is unable to pass through as if the transformer circuit 121 is an open circuit". Therefore, after sending the low frequency test signal, if the test units 11, 13 receive a low frequency response signal, then can identify a fact that an internal circuitry, which is disposed in the network transformer, between the transformer circuit and the test unit does not have an open circuit fault. Otherwise, if the test units 11, 13 does not receive the low frequency response signal, then can identify a fact that the internal circuitry has the open circuit fault (referred to as "open circuit test").

Similarly, after sending the high frequency test signal, if the test units 11, 13 receive a high frequency response signal, then can identify a fact that the first pins T1-T3 or the second pins M1-M3 of the network transformer 12, which corresponds to the first test unit 11 or the second test unit 13, has a short circuit fault. Otherwise, if the test units 11, 13 not receive a high frequency response signal, then can identify a fact that the first pins T1-T3 or the second pins M1-M3 of the network transformer 12 does not have the short circuit fault (referred to as "short circuit test").

In particular here, FIG. 1B is just a diagram illustrating a network transformer 12 according to some embodiments of the present disclosure. In that embodiment, the network transformer 12 at least includes one set of transformer circuits 121. In some other embodiments, the network transformer 12 further includes other components inside, and the number of the pins T1-T3, M1-M3 can be adjusted, too. Since the structure of network transformer 12 is a common knowledge technology in this field, it will not repeat here.

In addition, in some embodiments, both the first test unit 11 and the network output interface 131 have a boundary scan interface to receive test signals from outside. The first test unit 11 receives a test signal from a test machine and the network output interface 131 receives another test signal generated by the test card 132. In other some embodiments, the test signals may be generated from a external test machine to the network output interface 131. It is not limit to the test cards 132.

The connectivity testing method of the present disclosure is based on the boundary scan manner, but it improves the type of test signals, transmission sequence and detection principle. Referring to FIG. 1A and FIG. 1B, the traditional boundary scan manner are limited by isolation of the transformer circuit 121 within the network transformer 12, so that it cannot send or receive a boundary scan signal correctly between the first test unit 11 and the second test unit 13. The present disclosure divides an internal circuitry in the network transformer 12, which corresponding to the first test unit 11 and the transformer circuit 121, into a "first side S1" and divides the other internal circuitry in the network transformer 12, which corresponding to the second test unit 13 and the transformer circuit 121, into a "second side S2". Then, test each side S1, S2, respectively. Therefore, the method can be completed the test program accurately and quickly. In addition, operators can only perform the open circuit test or the short circuit tests according to their needs, and operators can also perform the open circuit tests and the short circuit tests in order.

In addition, in an embodiment of the present disclosure, the first test unit 11 is a network interface controller, but it is not limited to it. The operator may also send a high frequency test signal and a low frequency test signal directly to the network transformer 12 through a test machine, so as to detect whether the first side S1 has an open circuit fault or a short circuit fault.

Refer to FIG. 1A and FIG. 1B. The connectivity test method of the present disclosure utilizes the characteristic that the transformer circuit 121 isolates the two sides S1, S2 of the network transformer 12. The network transformer 12 is divided into "first side S1" and "second side S2" to test the connectivity respectively. Therefore, the test order of the first side 51 and the second side S2 can be adjusted arbitrarily without affecting the test result, which means that the test card 132 may send the test signal through the network output interface 131 first. Then, after identifying that the second side S2 is normal, the first test unit 11 sends out another test signal.

Figure 2:
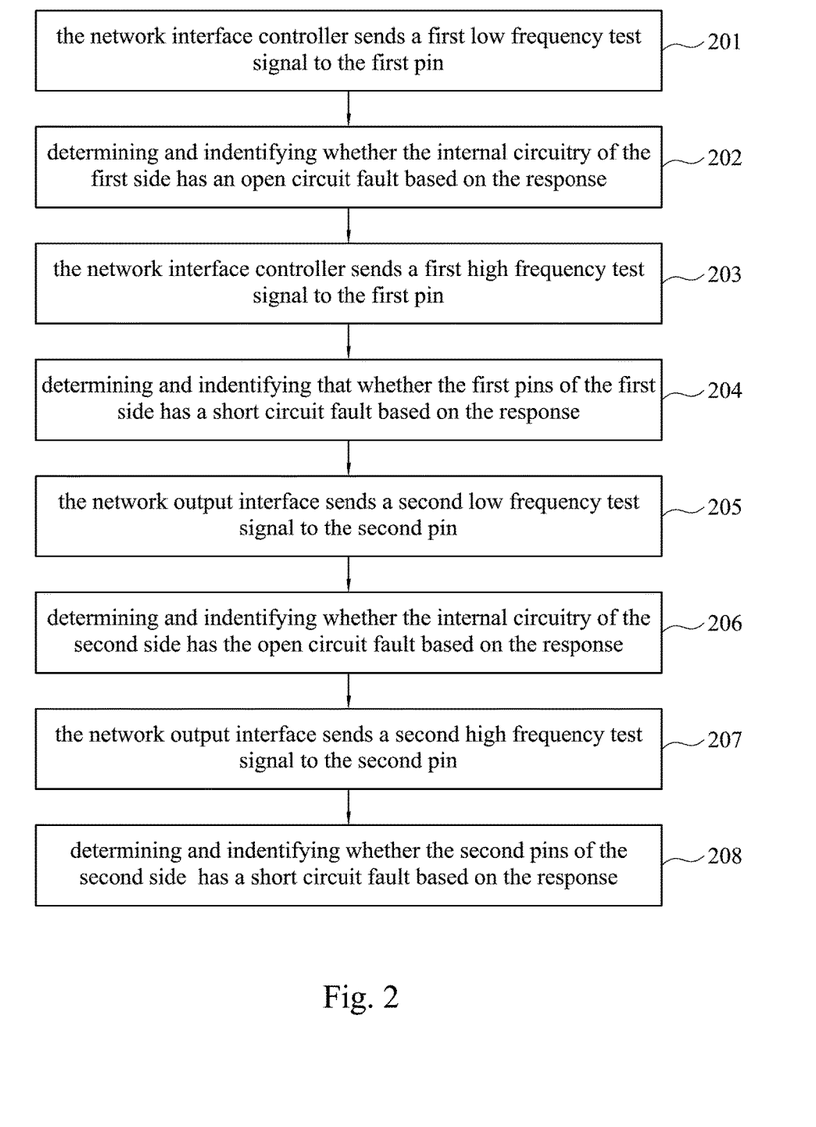
FIG. 2 is a flowchart illustrating a method according to a first embodiment of the present disclosure.

Refer to FIG. 2. FIG. 2 is a flowchart illustrating a method according to a first embodiment of the present disclosure.

(201) The first test unit 11 (network interface controller) sends a first low frequency test signal to the first pin T1 by using a boundary scan manner.

(202) Determining and identifying whether an internal circuitry of the first side S1 has an open circuit fault based on the response from the pin T2 or T3. If a low frequency response signal is received, it means that the internal circuitry of the first side S1 does not have an open circuit fault. On the contrary, if the low frequency response signal cannot be received, it means that the internal circuitry of the first side S1 has the open circuit fault and is unable to transmit signals.

(203) After identifying that the internal circuitry of the first side S1 does not have the open circuit fault, the first test unit 11 (the network interface controller) sends a first high frequency test signal to the first pin T1 by using a boundary scan manner.

(204) Determining and identifying whether the first pins T1-T3 of the first side S1 has a short circuit fault based on the response from the pin T2 or T3. Since the high frequency signal is unable to pass through the transformer circuit 121, If a high frequency response signal is received, it means that the first pins T1-T3 of the network transformer 12, which corresponds to the first test unit 11, has a short circuit fault (e.g., weld bridge between the first pins T1-T3). On the contrary, if the high frequency response signal cannot be received, it means the first pins T1-T3 of the network transformer 12 is normal and does not have the short circuit fault.

(205) After complete testing the connectivity of the first side S1 through above step (201)-(204), the network output interface 131 sends a second low frequency test signal to the second pin M1 by using a boundary scan manner. In this embodiment, the second low frequency test signal is generated by the test card 132.

(206) Determining and identifying whether the internal circuitry of the second side S2 has the open circuit fault based on the response from the second pin M2 or M3.

(207) After identifying that the internal circuitry of the second side S2 does not have the open circuit fault, the network output interface 131 sends a second high frequency test signal to the second pin M1 by using a boundary scan manner. In this embodiment, the second high frequency test signal is generated by the test card 132.

(208) Determining and identifying whether the second pins M1-M3 of the second side S2 has a short circuit fault based on the response from the second pin M2 or M3.

Figure 3:
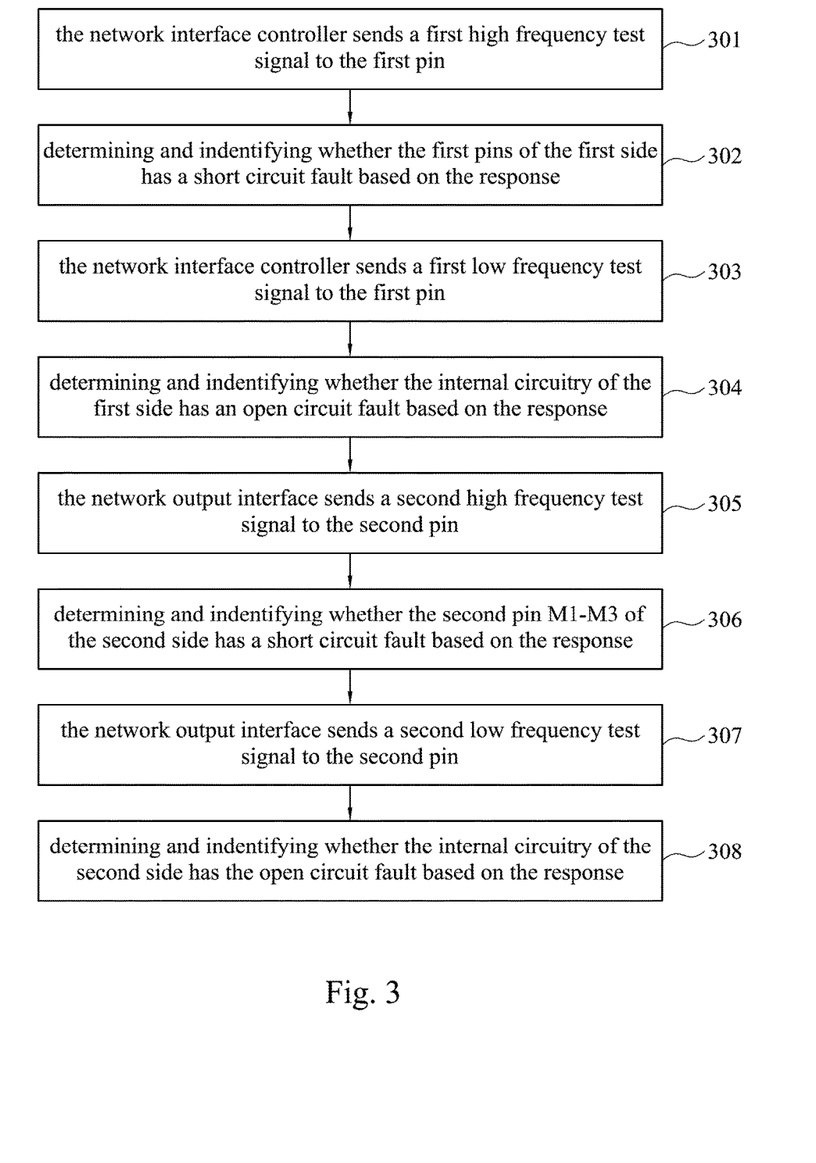
FIG. 3 is a flowchart illustrating a method according to a second embodiment of the present disclosure.

In the aforementioned embodiment, the present disclosure priority identify whether the internal circuitry, which is disposed in the network transformer, has the open circuit fault through low frequency test signal. Then, the present disclosure identify whether the pins T1-T3, M1-M3 of the network transformer 12 has a short circuit fault due to welding error through high frequency test signal. Accordingly, it is possible to fully determine whether a bad condition occurs in the network transformer 12. Since this method does not need to design the test pin, it can use the boundary scan interface on the test units 11 and 13 to receive the test signal, so the detection cost will not be increased significantly. In addition, in other embodiments, the test units 11 and 13 may send the high frequency test signal first. After identifying whether the pins T1-T3, M1-M3 of the network transformer 12 has a short circuit fault, identify whether the internal circuitry has the open circuit fault through low frequency test signal and identify whether the network transformer 12 is normal. As shown in FIG. 3, FIG. 3 is a flowchart illustrating a method according to a second embodiment of the present disclosure.

(301) The first test unit 11 (network interface controller) sends a first high frequency test signal to the first pin T1 by using a boundary scan manner to perform the "short circuit test".

(302) Determining and identifying whether the first pins T1-T3 of the first side 51 has a short circuit fault based on the response from the pin T2 or T3.

(303) After identifying that the internal circuitry of the first side S1 does not have the short circuit fault, the first test unit 11 (network interface controller) sends a first low frequency test signal to the first pin T1 by using a boundary scan manner to perform the "open circuit test".

(304) Determining and identifying whether the internal circuitry of the first side S1 has an open circuit fault based on the response from the pin T2 or T3.

(305) The network output interface 131 sends a second high frequency test signal to the second pin M1 by using a boundary scan manner to perform the "short circuit test". In this embodiment, the second high frequency test signal is generated by the test card 132.

(306) Determining and identifying whether the second pins M1-M3 of the second side S2 has a short circuit fault based on the response from the second pin M2 or M3.

(307) After identifying that the internal circuitry of the second side S2 does not have the short circuit fault, the network output interface 131 sends a second low frequency test signal to the second pin M1 by using a boundary scan manner to perform the "open circuit test". In this embodiment, the second low frequency test signal is generated by the test card 132.

(308) Determining and identifying whether an internal circuitry of the second side S2 has the open circuit fault based on the response from the second pin M2 or M3.

Figure 4:
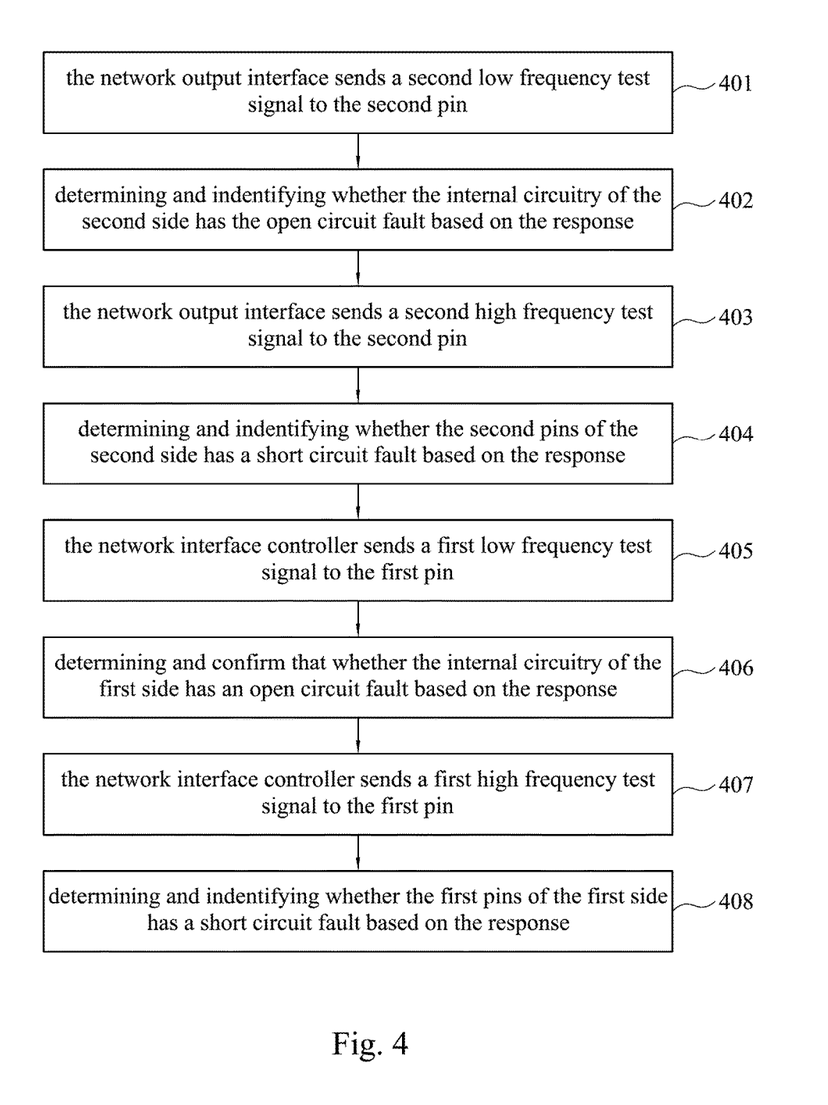
FIG. 4 is a flowchart illustrating a method according to a third embodiment of the present disclosure.

As above, due to the connectivity test method of the present disclosure divides the internal circuitry of the network transformer 12 into "first side S1" and "second side S2", the test order of the first side S1 and the second side S2 can be adjusted arbitrarily, and the test results are not affected. This means that the test program may also identify by the network output interface 131 whether the network transformer 12 has an open circuit fault or a short circuit fault before the first test unit 11 (network interface controller) sends the high frequency test signal and the low frequency test signal to the network transformer 12 respectively. Refer to FIG. 4, FIG. 4 is a flowchart illustrating a method according to a third embodiment of the present disclosure.

(401) the network output interface 131 sends a second low frequency test signal to the second pin M1 by using a boundary scan manner to perform the "open circuit test". In this embodiment, the second low frequency test signal is generated by the test card 132.

(402) Determining and identifying whether the internal circuitry of the second side S2 has the open circuit fault based on the response from the second pin M2 or M3.

(403) After identifying that the internal circuitry of the second side S2 does not have the open circuit fault, the network output interface 131 sends a second high frequency test signal to the second pin M1 by using a boundary scan manner to perform the "short circuit test". In this embodiment, the second high frequency test signal is generated by the test card 132.

(404) Determining and identifying whether the second pins M1-M3 of the second side S2 has a short circuit fault based on the response from the second pin M2 or M3.

(405) the first test unit 11 (network interface controller) sends a first low frequency test signal to the first pin T1 by using a boundary scan manner to perform the "open circuit test".

(406) Determining and identifying whether the internal circuitry of the first side S1 has an open circuit fault based on the response from the pin T2 or T3.

(407) After identifying that the internal circuitry of the first side S1 does not have the open circuit fault, the first test unit 11 (network interface controller) sends a first high frequency test signal to the first pin T1 by using a boundary scan manner to perform the "short circuit test".

(408) Determining and identifying whether the first pins T1-T3 of the first side S1 has a short circuit fault based on the response from the pin T2 or T3.

Figure 5:
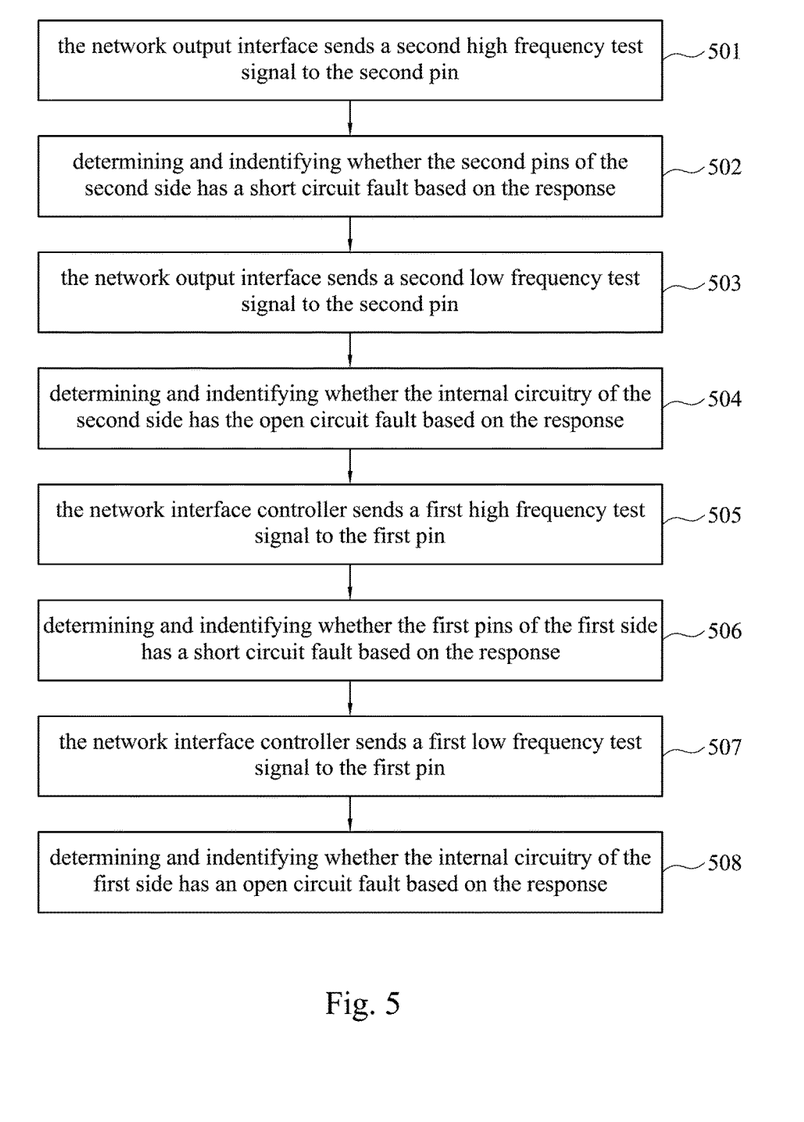
FIG. 5 is a flowchart illustrating a method according to a fourth embodiment of the present disclosure.

On the other hand, in the steps shown in FIG. 4, the test units 11, 13 may priority perform the "short circuit test", then perform the "open circuit test". As shown in FIG. 5, FIG. 3 is a flowchart illustrating a method according to a fourth embodiment of the present disclosure.

(501) The network output interface 131 sends a second high frequency test signal to the second pin M1 by using a boundary scan manner to perform the "short circuit test". In this embodiment, the second high frequency test signal is generated by the test card 132.

(502) Determining and identifying whether the second pins M1-M3 of the second side S2 has a short circuit fault based on the response from the second pin M2 or M3.

(503) After identifying that the internal circuitry of the second side S2 does not have the short circuit fault, the network output interface 131 sends a second low frequency test signal to the second pin M1 by using a boundary scan manner to perform the "open circuit test". In this embodiment, the second low frequency test signal is generated by the test card 132.

(504) Determining and identifying whether an internal circuitry of the second side S2 has the open circuit fault based on the response from the second pin M2 or M3.

(505) The first test unit 11 (network interface controller) sends a first high frequency test signal to the first pin T1 by using a boundary scan manner to perform the "short circuit test".

(506) Determining and identifying whether the first pins T1-T3 of the first side S1 has a short circuit fault based on the response from the pin T2 or T3.

(507) After identifying that the internal circuitry of the first side S1 does not have the short circuit fault, the first test unit 11 (network interface controller) sends a first low frequency test signal to the first pin T1 by using a boundary scan manner to perform the "open circuit test".

(508) Determining and identifying whether the internal circuitry of the first side S1 has an open circuit fault based on the response from the pin T2 or T3.

The difference in four embodiments shown in FIG. 2 to FIG. 5 is that the transmission order of the high frequency test signal, the low frequency test signal and the test order of the first side S1 and the second side S2, but the difference will not affect the test results. In addition, in some embodiments, the low frequency test signal may be a simple DC signal and the high frequency test signal may be an AC signal with a frequency of 1,000 Hz to a 1 MHz. The frequency range is not limited to the above values.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for testing connectivity, which is applied to an electronic equipment, wherein the electronic equipment at least comprises a plurality of test units and a network transformer, the test units are respectively coupled electrically to the network transformer, and the network transformer at least comprises a transformer circuit, and the method comprises:
    a test unit of the test units sending a low frequency test signal or a high frequency test signal to the network transformer by using a boundary scan manner;
    determining whether the test unit receives a low frequency response signal or a high frequency response signal;
    identifying that an internal circuitry, which is disposed in the network transformer and between the transformer circuit and the test unit, does not have an open circuit fault, when the test unit receives the low frequency response signal; otherwise, identifying that the internal circuitry, which is disposed in the network transformer and between the transformer circuit and the test unit, have an open circuit fault, when the test unit does not receive the low frequency response signal; and
    identifying that a pin of the network transformer, which corresponds to the test unit, has a short circuit fault, when the test unit receives the high frequency response signal; otherwise, identifying that the pin of the network transformer, which corresponds to the test unit, does not have the short circuit fault, when the test unit does not receive the high frequency response signal.

2. The method of claim 1, wherein the test units comprise a first test unit and a second test unit, the first test unit is electrically coupled to a plurality of first pins of the network transformer and the second test unit is electrically coupled to a plurality of second pins of the network transformer, the first test unit or the second test unit sends the low frequency test signal and the high frequency test signal to one of the first pins or one of the second pins, and the first test unit or the second test unit receives the low frequency response signal and the high frequency response signal from another first pin or another second pin.

3. The method of claim 2, wherein the first test unit is a network interface controller, the second test unit comprises a network output interface, and the network output interface is electrically coupled to the second pins.

4. The method of claim 3, wherein the network interface controller sends the low frequency test signal, and after identifying that the internal circuitry, which is disposed in the network transformer, does not have the open circuit fault, the network interface controller sends the high frequency test signal.

5. The method of claim 4, wherein the network output interface sends the low frequency test signal, and after identifying that the internal circuitry, which is disposed in the network transformer, does not have the open circuit fault, the network output interface sends the high frequency test signal.

6. The method of claim 3, wherein the network interface controller sends the high frequency test signal, and after identifying that the pins of the network transformer does not have the open circuit fault, the network interface controller sends the low frequency test signal.

7. The method of claim 6, wherein the network output interface sends the high frequency test signal, and after identifying that the pins of the network transformer does not have the open circuit fault, the network output interface sends the low frequency test signal.

8. The method of claim 4, wherein after the network interface controller sends the high frequency test signal and the low frequency test signal to identify whether the network transformer has the open circuit fault or the short circuit fault, the network output interface sends the high frequency test signal and the low frequency test signal to the network transformer, respectively.

9. The method of claim 4, wherein after the network output interface sends the high frequency test signal and the low frequency test signal to identify whether the network transformer has the open circuit fault or the short circuit fault, the network interface controller sends the high frequency test signal and the low frequency test signal to the network transformer, respectively.

10. The method of claim 5, wherein after the network interface controller sends the high frequency test signal and the low frequency test signal to identify whether the network transformer has the open circuit fault or the short circuit fault, the network output interface sends the high frequency test signal and the low frequency test signal to the network transformer, respectively.

11. The method of claim 5, wherein after the network output interface sends the high frequency test signal and the low frequency test signal to identify whether the network transformer has the open circuit fault or the short circuit fault, the network interface controller sends the high frequency test signal and the low frequency test signal to the network transformer, respectively.

12. The method of claim 6, wherein after the network interface controller sends the high frequency test signal and the low frequency test signal to identify whether the network transformer has the open circuit fault or the short circuit fault, the network output interface sends the high frequency test signal and the low frequency test signal to the network transformer, respectively.

13. The method of claim 6, wherein after the network output interface sends the high frequency test signal and the low frequency test signal to identify whether the network transformer has the open circuit fault or the short circuit fault, the network interface controller sends the high frequency test signal and the low frequency test signal to the network transformer, respectively.

14. The method of claim 7, wherein after the network interface controller sends the high frequency test signal and the low frequency test signal to identify whether the network transformer has the open circuit fault or the short circuit fault, the network output interface sends the high frequency test signal and the low frequency test signal to the network transformer, respectively.

15. The method of claim 7, wherein after the network output interface sends the high frequency test signal and the low frequency test signal to identify whether the network transformer has the open circuit fault or the short circuit fault, the network interface controller sends the high frequency test signal and the low frequency test signal to the network transformer, respectively.

* * * * *